(12) United States Patent
Chang et al.

(10) Patent No.: US 12,477,830 B2
(45) Date of Patent: Nov. 18, 2025

(54) INTEGRATED CIRCUIT AND METHOD FOR MANUFACTURING THE SAME

(71) Applicant: Taiwan Semiconductor Manufacturing Company, Ltd., Hsinchu (TW)

(72) Inventors: Chin-Ho Chang, Hsinchu (TW); Yi-Wen Chen, Hsinchu (TW); Jaw-Juinn Horng, Hsinchu (TW); Yung-Chow Peng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/361,899

(22) Filed: Jul. 30, 2023

(65) Prior Publication Data

US 2023/0369311 A1 Nov. 16, 2023

Related U.S. Application Data

(62) Division of application No. 17/363,355, filed on Jun. 30, 2021, now Pat. No. 11,756,950.

(60) Provisional application No. 63/137,535, filed on Jan. 14, 2021.

(51) Int. Cl.
*H01L 27/02* (2006.01)
*H01L 27/092* (2006.01)
*H10D 84/01* (2025.01)
*H10D 84/03* (2025.01)
*H10D 84/85* (2025.01)
*H10D 89/10* (2025.01)

(52) U.S. Cl.
CPC ......... *H10D 89/10* (2025.01); *H10D 84/0186* (2025.01); *H10D 84/038* (2025.01); *H10D 84/85* (2025.01)

(58) Field of Classification Search
CPC . H01L 27/0207; H01L 27/088; H01L 27/092; H01L 27/0922
See application file for complete search history.

(56) References Cited

U.S. PATENT DOCUMENTS

| 5,532,509 A | * | 7/1996 | D'Addeo | .......... H01L 27/11898 |
| | | | | 257/E27.11 |
| 2011/0050317 A1 | * | 3/2011 | Nonaka | ............ H03K 17/04206 |
| | | | | 327/333 |
| 2020/0105739 A1 | | 4/2020 | Yang et al. | |
| 2020/0192412 A1 | | 6/2020 | Tsumura | |
| 2021/0089875 A1 | | 3/2021 | Tran et al. | |

FOREIGN PATENT DOCUMENTS

| KR | 2014-0093693 A | 7/2014 |
| TW | 201533908 A | 9/2015 |
| TW | 201946249 A | 12/2019 |
| TW | 202015239 A | 4/2020 |

* cited by examiner

*Primary Examiner* — Walter H Swanson
(74) *Attorney, Agent, or Firm* — Finnegan, Henderson, Farabow, Garrett & Dunner, L.L.P.

(57) ABSTRACT

An integrated circuit includes a first circuit with m first units coupled in parallel, any of the first units including one or more first transistors coupled in series, and a second circuit with n second units coupled in parallel, any of the second units including one or more second transistors coupled in series. A gate terminal of the first circuit is coupled to a gate terminal of the second circuit. M and n are different positive integers.

20 Claims, 13 Drawing Sheets

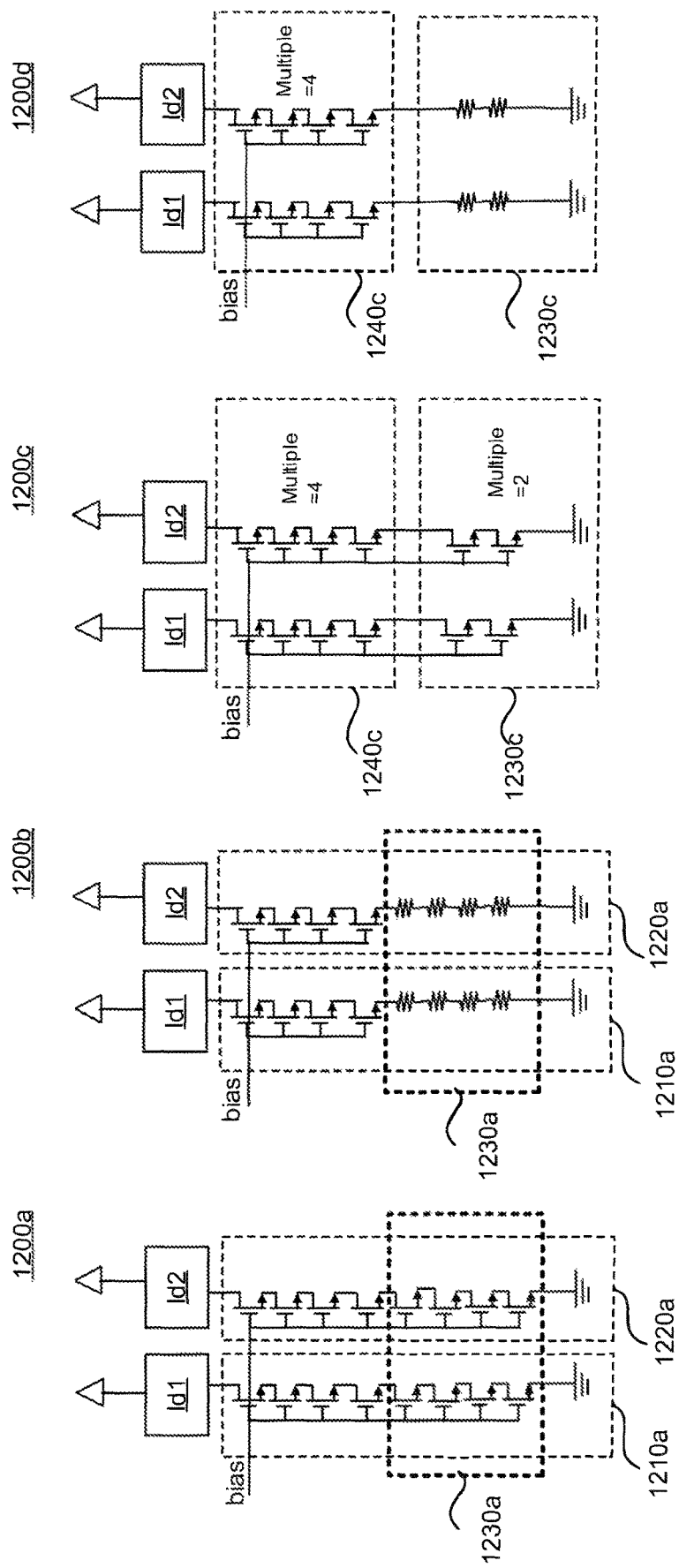

INTEGRATED CIRCUIT AND METHOD FOR MANUFACTURING THE SAME

REFERENCE TO RELATED APPLICATION

This application is a divisional application of U.S. Nonprovisional patent application Ser. No. 17/363,355, filed on Jun. 30, 2021, which claims the benefit of U.S. Provisional Application No. 63/137,535, filed on Jan. 14, 2021, entitled "STACKED-GATE TRANSISTORS CIRCUIT DESIGN FOR ANALOG CIRCUIT APPLICATION," all of which are incorporated herein by reference in their entireties.

BACKGROUND

Integrated circuit design in the deep-submicron process (e.g., 16 nm, 7 nm, 5 nm and beyond) faces some challenges and limitations. For example, particular bottlenecks occur in the manufacturing of circuits incorporating microelectronic components such as transistors, amplifiers, and current mirrors at deep-submicron levels. As process scaling advances further, these challenges and limitations will become more significant to the advance processing of IC manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A is a schematic diagram illustrating an integrated circuit using NMOS, in accordance with some embodiments of the present disclosure.

FIG. 12B is a schematic diagram illustrating an equivalent circuit of the integrated circuit in FIG. 12A, in accordance with some embodiments of the present disclosure.

FIG. 12C is a schematic diagram illustrating an integrated circuit using NMOS, in accordance with some embodiments of the present disclosure.

FIG. 12D is a schematic diagram illustrating an equivalent circuit of the integrated circuit in FIG. 12C, in accordance with some embodiments of the present disclosure.

DETAILED DESCRIPTION

Figure 1:
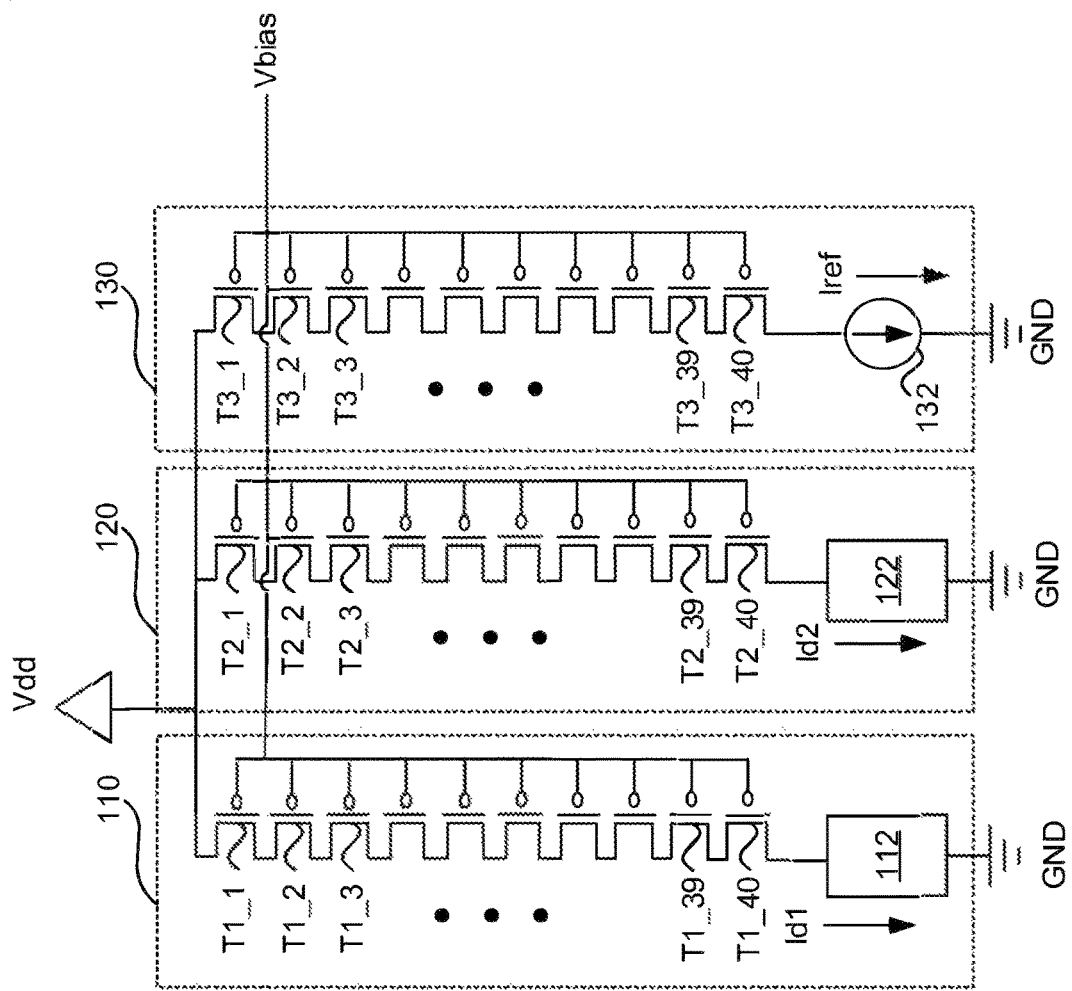
FIG. 1 is a schematic diagram illustrating an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

As integrated circuit (IC) manufacturing processes scale down (e.g., 32 nm, 20 nm, 16 nm, 7 nm, 5 nm, or beyond), parameters of electronic components (e.g., transistors) are limited in size. Therefore, metal-oxide-semiconductor field-effect transistors (MOSFET) with long channel lengths are no longer feasible in advanced processes. However, in some analog circuit design, MOSFET with long channel lengths are still needed for improving performances/characteristics of the MOSFET, such as improving an output resistance (Rout) or a current mismatch performance within a current mirror circuit.

In some embodiments of the present disclosure, plural stages of transistors (e.g., MOSFETs) with small channel lengths can be stacked together to form one equivalent transistor with a long channel length. Reference is made to FIG. 1, which is a schematic diagram illustrating an integrated circuit 100 in accordance with some embodiments of the present disclosure. As shown in FIG. 1, the integrated circuit 100 is a current mirror circuit including two or more current mirror legs. A reference current can be determined by an active device (e.g., a current source) on one current mirror leg. The current mirror circuit is utilized to generate current(s) with an identical magnitude mirrored from the reference current on the other mirror legs.

For example, the integrated circuit 100 shown in FIG. 1 includes three current mirror legs 110, 120 and 130. The current mirror leg 110 includes multiple transistors T1_1-T1_40. The current mirror leg 120 includes multiple transistors T2_1-T2_40. The current mirror leg 130 includes multiple transistors T3_1-T3_40.

As shown in FIG. 1, a reference current Iref is determined by a current source 132 on the current mirror leg 130. The integrated circuit 100 is configured to duplicate or mirror currents from the current mirror leg 130 onto the current mirror legs 110 and 120, so as to generate first current Id1 through the current mirror leg 110 and the second current Id2 through the current mirror leg 120 to drive loads 112 and 122 respectively connected to the current mirror legs 110 and 120.

In ideal cases, both of the first current Id1 and the second current Id2 shall be equal to the reference current Iref. However, due to process variations, the characteristics (e.g., channel length, device size, threshold voltage, etc.) of the transistors between different current mirror legs 110, 120, and 130 are not exactly the same. Accordingly, a current mismatch exists between the reference current Iref on the current mirror leg 130, the first current Id1 on the current mirror leg 110, and the second current Id2 on the current mirror leg 120.

Particularly, in analog circuit operations, a part of the current mismatch in the current mirror is due to the unequal threshold voltages. In some cases, it may be desirable to implement one transistor with a long channel length in the current mirror leg to reduce the current mismatch. However, the transistor with the long channel length is not a suitable implementation for advanced processes (e.g., 32 nm, 20 nm, 16 nm, 7 nm, 5 nm, or beyond process).

In some embodiments of the present disclosure, the current mirror leg 110 includes transistors T1_1-T1_40. The transistors T1_1-T1_40 are electrically connected in series between a first terminal and a second terminal and with their respective gates tied together. As shown in FIG. 1, the first transistors T1_1-T1_40 can be p-channel metal-oxide-semiconductor field-effect transistors (p-MOSFET, or PMOS), and the first terminal is a positive supply voltage terminal Vdd, and the second terminal is a system ground terminal GND, but the present disclosure is not limited thereto. In some embodiments, the first transistors T1_1-T1_40 can be n-channel metal-oxide-semiconductor field-effect transistors (n-MOSFET, or NMOS).

In the embodiments of FIG. 1, each of the current mirror legs 110, 120, and 130 includes 40 stages of transistors (e.g., transistors T1_1-T1_40 in the current mirror leg 110, transistors T2_1-T2_40 in the current mirror leg 120, transistors T3_1-T3_40 in the current mirror leg 130), but the present disclosure is not limited thereto. For example, in the current mirror leg 110, one end (e.g., a source terminal) of the transistor T1_1 at the 1st stage is connected to the positive supply voltage terminal Vdd, and another end (e.g., a drain terminal) of the transistor T1_1 is connected to one end (e.g., a source terminal) of the transistor T1_2 at the 2nd stage. Another end (e.g., a drain terminal) of the transistor T1_2 at the 2nd stage is connected to one end (e.g., a source terminal) of the transistor T1_3 at the 3rd stage, and so on. At least, one end (e.g., a source terminal) of the transistor T1_40 at the 40th stage is connected to one end (e.g., a drain terminal) of the transistor T1_39 at the 39th stage, and another end (e.g., a drain terminal) of the transistor T1_40 at the 40th stage is connected to the system ground terminal GND. In addition, control terminals (e.g., gate terminals) of transistors T1_1-T1_40 can be controlled by a bias voltage Vbias. Based on connections between the transistors T1_1-T1_40, the gate-stacked transistors T1_1-T1_40 can form an equivalent single transistor. In some embodiments, the transistors T1_1-T1_40 with relatively short channel lengths (e.g., about 0.1 μm, each) are equivalent to the single transistor with a relatively long channel length (e.g., about 4 μm).

Similarly, the current mirror leg 120 includes 40 stages of the transistors T2_1-T2_40. The transistors T2_1-T2_40 are electrically connected in series between the positive supply voltage terminal Vdd and the system ground terminal GND. The gates of the transistors T2_1-T2_40 are connected together and controlled by the bias voltage Vbias. The current mirror leg 130 also includes 40 stages of the transistors T3_1-T3_40. Details of the gate-stacked structure of the current mirror leg 130 is similar to the current mirror legs 110 and 120 and thus not repeated herein for the sake of brevity. Based on the connections between the transistors T2_1-T2_40 and the connections between the transistors T3_1-T3_40, the transistors T2_1-T2_40 are equivalent to a single transistor in the current mirror leg 120, and the transistors T3_1-T3_40 are equivalent to a single transistor in the current mirror leg 130. In some embodiments, the transistors T2_1-T2_40 or T3_1-T3_40 with relatively short channel lengths are equivalent to the single transistor with a relatively long channel length in the corresponding current mirror leg. However, each current mirror leg 110, 120, or 130 is not limited to including 40 stages of transistor. In some embodiments, each current mirror leg includes N stages of transistor, N being a positive integer. Furthermore, in some embodiments, the integrated circuit 100 may include two or more current mirror legs, depending on the number of loads, and is not limited to including three current mirror legs 110, 120, and 130.

Figure 2B:
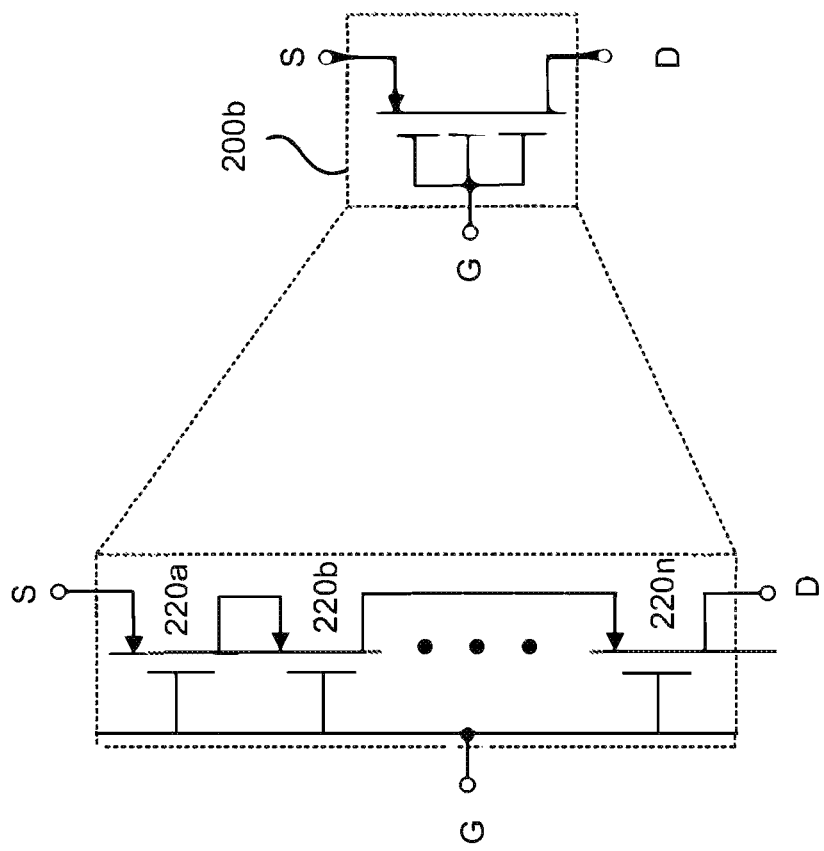
FIG. 2A and FIG. 2B are schematic diagrams respectively illustrating an equivalent stacked-gate transistor using n-channel metal-oxide-semiconductor field-effect transistors (n-MOSFET, or NMOS) components and an equivalent stacked-gate transistor using p-channel metal-oxide-semiconductor field-effect transistors (p-MOSFET, or PMOS) components in accordance with some embodiments of the present disclosure.
Figure 2A:
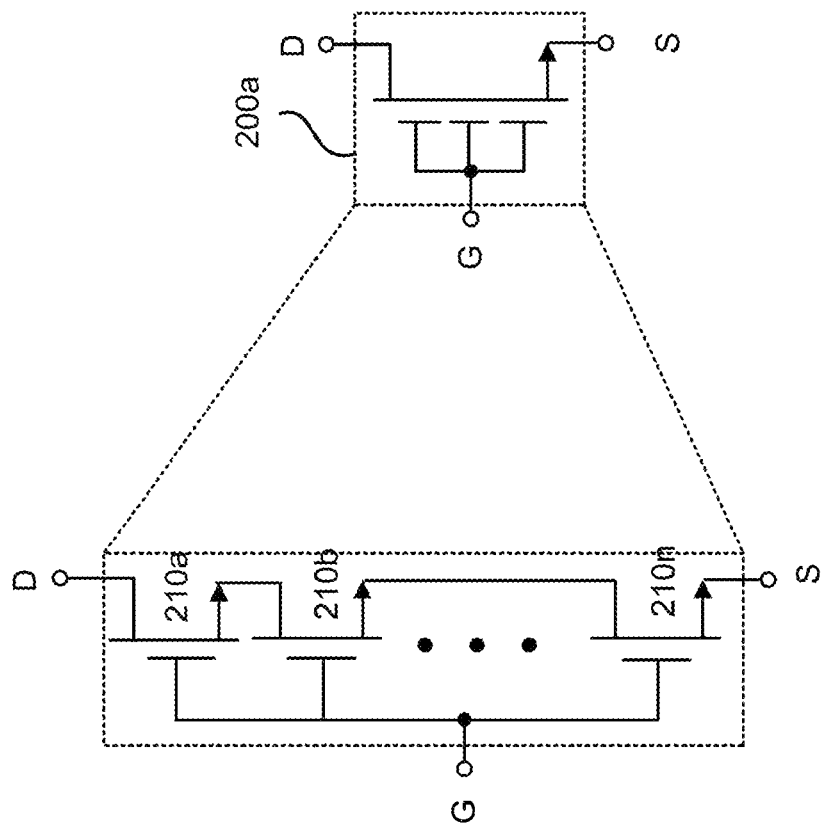

References are made to FIG. 2A and FIG. 2B, which are schematic diagrams respectively illustrating an equivalent stacked-gate transistor 200a using n-MOSFET components and an equivalent stacked-gate transistor 200b using p-MOSFET components in accordance with some embodiments of the present disclosure. As illustrated in FIG. 2A, a gate terminal of the stacked-gate transistor 200a is coupled to gate terminals of n-MOSFET devices 210a-210n, a drain terminal of the stacked-gate transistor 200a is coupled to a drain terminal of the n-MOSFET device 210a at the first stage, and a source terminal of the stacked-gate transistor 200a is coupled to a source terminal of the n-MOSFET device 210n at the Nth stage. The n-MOSFET devices 210a-210n are coupled in series. As illustrated in FIG. 2B, a gate terminal of the stacked-gate transistor 200b is coupled to gate terminals of p-MOSFET devices 220a-220n, a source terminal of the stacked-gate transistor 200a is coupled to a source terminal of the p-MOSFET device 220a at the first stage, and a drain terminal of the stacked-gate transistor 200a is coupled to a drain terminal of the p-MOSFET device 220n at the Nth stage. The p-MOSFET devices 220a-220n are coupled in series.

Figure 3:
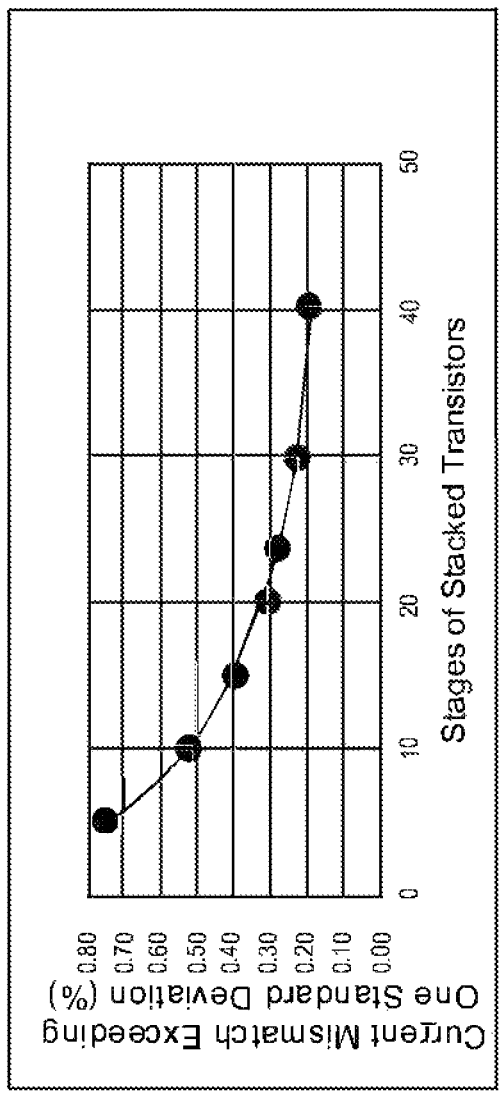
FIG. 3 is a schematic diagram illustrating a simulation result of a relationship between percentages of the current mismatch exceeding one standard deviation and the stage numbers of the stacked transistors, in accordance with some embodiments of the present disclosure.

Reference is made to FIG. 3, which is a schematic diagram illustrating a simulation result of a relationship between percentages of the current mismatch exceeding one standard deviation and the stage numbers of the stacked transistors in accordance with some embodiments of the present disclosure. The simulation shown in FIG. 3 can be performed under a bias current (e.g., at about 20 uA) for current mirror circuits having different stage numbers. As shown in FIG. 3, the mismatch of the current mirror is correlated to the stage numbers of the current mirror. When the stack gate number is increased, the mismatch of the current mirror circuit is reduced accordingly.

By stacking multiple transistors (e.g., n-MOSFET devices 210a-210n in FIG. 2A or p-MOSFET devices 220a-220n in FIG. 2B) each with a specific channel length as allowed in the advance processes, an equivalent transistor (e.g., transistor 200a in FIG. 2A or transistor 200b in FIG. 2B) with the long channel length can be achieved to meet the desired performances or characteristics (e.g., the current mismatch) of the circuit. Referring back to FIG. 1, based on the gate-stacking structure, the current mirror legs 110, 120 and 130 respectively include the equivalent transistors with long channel lengths, such that the mismatch between the reference current Iref, the first current Id1, and the second current Id2 can be reduced.

Figure 4:
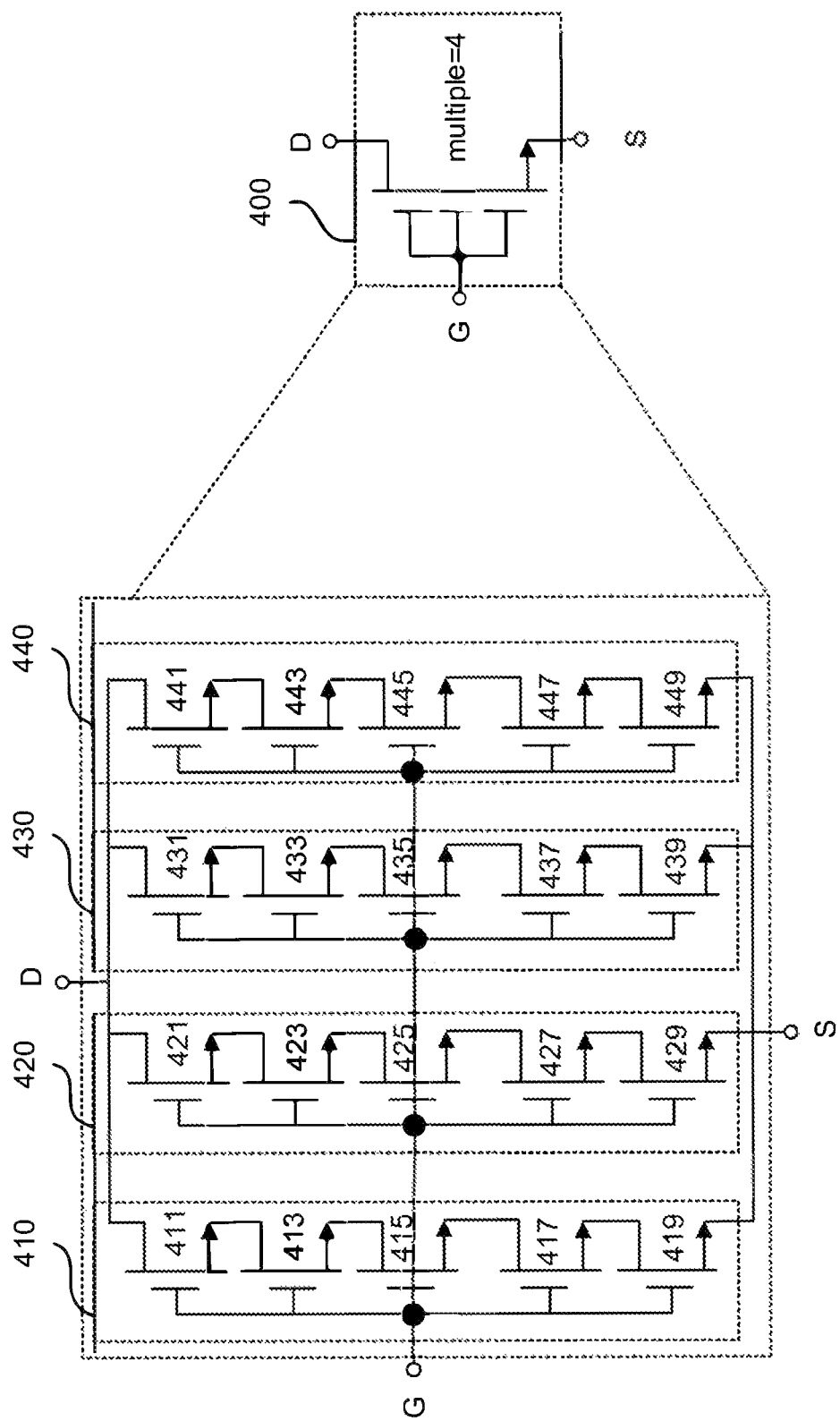
FIG. 4 is a schematic diagram illustrating an equivalent stacked-gate transistor using n-MOSFET components, in accordance with some embodiments of the present disclosure.

Reference is made to FIG. 4, which is a schematic diagram illustrating an equivalent stacked-gate transistor 400 using n-MOSFET components in accordance with some embodiments of the present disclosure. As shown in FIG. 4, in some embodiments, the equivalent stacked-gate transistor 400 may include multiple units 410, 420, 430, and 440 of stacked-gate circuits coupled in parallel. For example, the unit 410 includes transistors 411, 413, 415, 417, and 419 coupled in series. The unit 420 includes transistors 421, 423, 425, 427, and 429 coupled in series. The unit 430 includes transistors 431, 433, 435, 437, and 439 coupled in series. The unit 440 includes transistors 441, 443, 445, 447, and 449 coupled in series. Gate terminals of transistors 411-419, 421-429, 431-439, and 441-449 are coupled together to a control terminal G (e.g., a gate terminal) of the stacked-gate transistor 400 to receive the bias voltage. Drain terminals of the first-stage transistors 411, 421, 431, and 441 in units 410, 420, 430, and 440 are coupled together to a drain terminal D of the stacked-gate transistor 400. Source terminals of the last-stage transistors 419, 429, 439, and 449 in units 410, 420, 430, and 440 are coupled together to a source terminal S of the stacked-gate transistor 400. In some embodiments, the transistor 400 formed by four parallel-connected units of transistors is referred as a stacked-gate circuit with the "multiple" value of 4.

In some embodiments, each of unit 410, 420, 430, or 440 is not limited to including five stages of serial-connected transistors as illustrated in FIG. 4. In some embodiments, each unit may include one or more stages of transistors. Furthermore, in some embodiments, the stacked-gate transistor 400 may include one or more units, depending on its "multiple" value, and is not limited to including four units 410, 420, 430, and 440.

Figure 5:
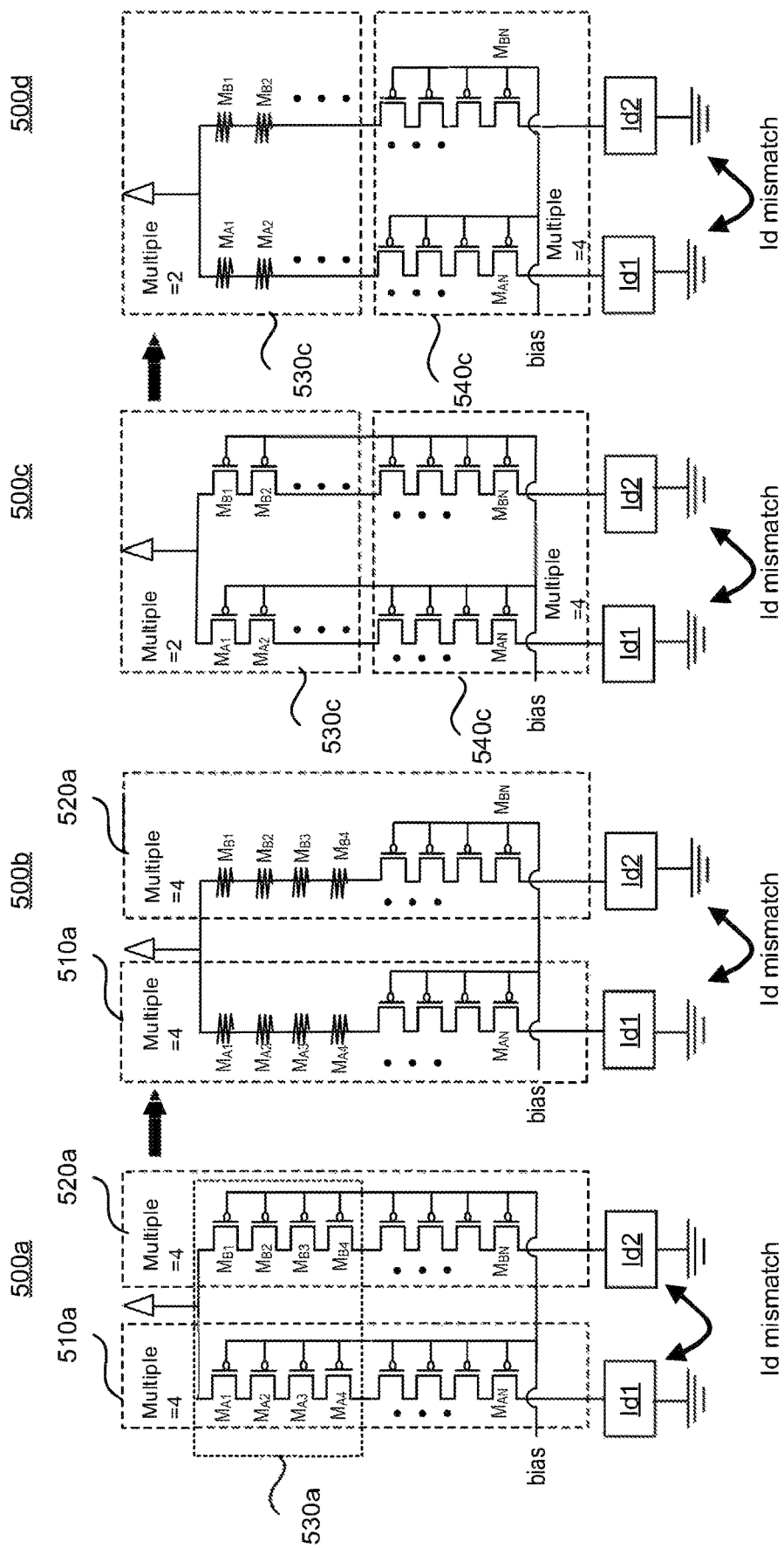
FIG. 5A is a schematic diagram illustrating an integrated circuit, in accordance with some embodiments of the present disclosure.
FIG. 5B is a schematic diagram illustrating an equivalent circuit of the integrated circuit in FIG. 5A, in accordance with some embodiments of the present disclosure.
FIG. 5C is a schematic diagram illustrating an integrated circuit, in accordance with some embodiments of the present disclosure.
FIG. 5D is a schematic diagram illustrating an equivalent circuit of the integrated circuit in FIG. 5C, in accordance with some embodiments of the present disclosure.

Reference is made to FIG. 5A and FIG. 5B. FIG. 5A is a schematic diagram illustrating an integrated circuit 500a in accordance with some embodiments of the present disclosure. As shown in FIG. 5A, the integrated circuit 500a has two legs 510a and 520a. Transistors MA1-MAN in the leg 510a and MB1-MBN in the leg 520a have the same multiple value (e.g., the multiple value of 4). In some embodiments, transistors MA1-MA4 and MB1-MB4 in a region 530a adjacent to the source side (e.g., the side close to the positive supply voltage terminal Vdd) operate at the linear region as source degeneration resistors. FIG. 5B is a schematic diagram illustrating an equivalent circuit 500b of the integrated circuit 500a in FIG. 5A, in accordance with some embodiments of the present disclosure. As shown in FIG. 5B, transistors MA1-MA4 and MB1-MB4 can be represented by corresponding equivalent resistors.

Because the transistors MA1-MA4 and MB1-MB4 operating at the linear region has little impact on the current mismatch between the current Id1 and current Id2, in some embodiments, the "multiple" value of transistors MA1-MA4 and MB1-MB4 in the region 530a can be reduced. By reducing the parallel-connected units of transistors MA1-MAN and MB1-MBN, the area of the integrated circuit 500a can be reduced without sacrificing the current mismatch performance.

Reference is made to FIG. 5C and FIG. 5D. FIG. 5C is a schematic diagram illustrating an integrated circuit 500c in accordance with some embodiments of the present disclosure. FIG. 5D is a schematic diagram illustrating an equivalent circuit 500d of the integrated circuit 500c in FIG. 5C, in accordance with some embodiments of the present disclosure. Compared to the integrated circuit 500a in FIG. 5A, as shown in FIG. 5C, each leg in the integrated circuit 500c includes two regions 530c and 540c. The region 530c is adjacent to the source side (e.g., the side close to the positive supply voltage terminal Vdd), and the region 540c is adjacent to the drain side (e.g., the side close to the system ground).

As shown in FIG. 5C, transistors in the region 530c (e.g., MA1, MA2, MB1, and MB2) have a first multiple value (e.g., the multiple value of 2), and transistors in the region 540c have a second multiple value (e.g., the multiple value of 4) being greater than the first multiple value. Because transistors in the region 530c operate at the linear region as source degeneration resistors, as shown in FIG. 5D, transistors MA1, MA2, MB1, and MB2 can be represented by corresponding equivalent resistors.

In general, the overall resistances of the equivalent circuit 500b in FIG. 5B and the equivalent circuit 500d in FIG. 5D are similar. Alternatively stated, in the integrated circuit 500c, although the multiple value of transistors in the region 530c is reduced to 2, the resulting source-degeneration resistance is similar to the source-degeneration resistance of the integrated circuit 500a in which the multiple value is 4. Accordingly, the integrated circuit 500c can achieve a similar current mismatch performance using a smaller area of the circuit.

Figure 6:
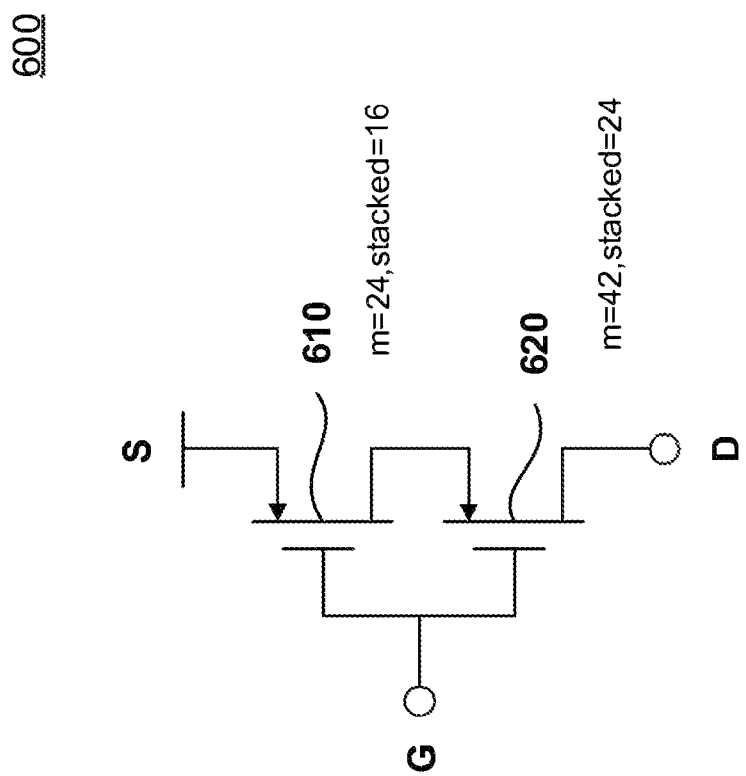
FIG. 6 is a schematic diagram illustrating a stacked-gate circuit, in accordance with some embodiments of the present disclosure.

References are made to FIG. 6, which is a schematic diagram illustrating a stacked-gate circuit 600 using PMOS in accordance with some embodiments of the present disclosure. As illustrated in FIG. 6, the stacked-gate circuit 600 includes a first stage circuit 610 and a second stage circuit 620.

The second stage circuit 620 is coupled to the first stage circuit 610. Particularly, the gate terminal of the first stage circuit 610 is coupled to the gate terminal of the second stage circuit 620 to form the control terminal G of the stacked-gate circuit 600. A drain terminal of the first stage circuit 610 is coupled to a source terminal of the second stage circuit 620. A source terminal of the first stage circuit 610 can be configured as a source terminal S of the stacked-gate circuit 600. A drain terminal of the second stage circuit 620 can be configured as a drain terminal D of the stacked-gate circuit 600.

In some embodiments, the first stage circuit 610 includes m units coupled in parallel, in which each unit includes one or more transistors coupled in series. For example, the first stage circuit 610 may include 24 units (e.g., with the multiple value of 24) and 16 stages of transistors with their respective gates coupled together. The second stage circuit 620 includes n units coupled in parallel, in which each unit includes one or more transistors coupled in series. As another example, the second stage circuit 620 may include 42 units (e.g., with the multiple value of 42) and 24 stages of transistors with their respective gates coupled together. As explained above, m and n are different positive integers. In some embodiments, m can be any positive integer smaller than n to reduce the circuit area of the first stage circuit 610.

By arranging different numbers of units (e.g., different multiple values) of transistors in different stages in the stacked-gate circuit 600, the total area required by the circuit can be reduced without degrading the circuit performance. Accordingly, a similar current mismatch characteristic can be achieved in a relatively small size integrate circuit. In some embodiments, a simulation indicates that a roughly 23% reduction in area can be achieved without performance degradation by using the stacked-gate circuit 600 (having 24 stages with a multiple value of 42 adjacent to the drain end of the circuit and 16 stages with a multiple value of 24 adjacent to the source end of the circuit) to replace a 43-stage circuit with a multiple value of 42 for all stages. Both the original 43-stage circuit and the proposed circuit stacked-gate circuit 600 achieve the current mismatch of about 0.17% between different current legs.

In some embodiments, different arrangements of multiples values at different stages can be selected to optimize performance of various types of analog circuit applications.

Figure 8:
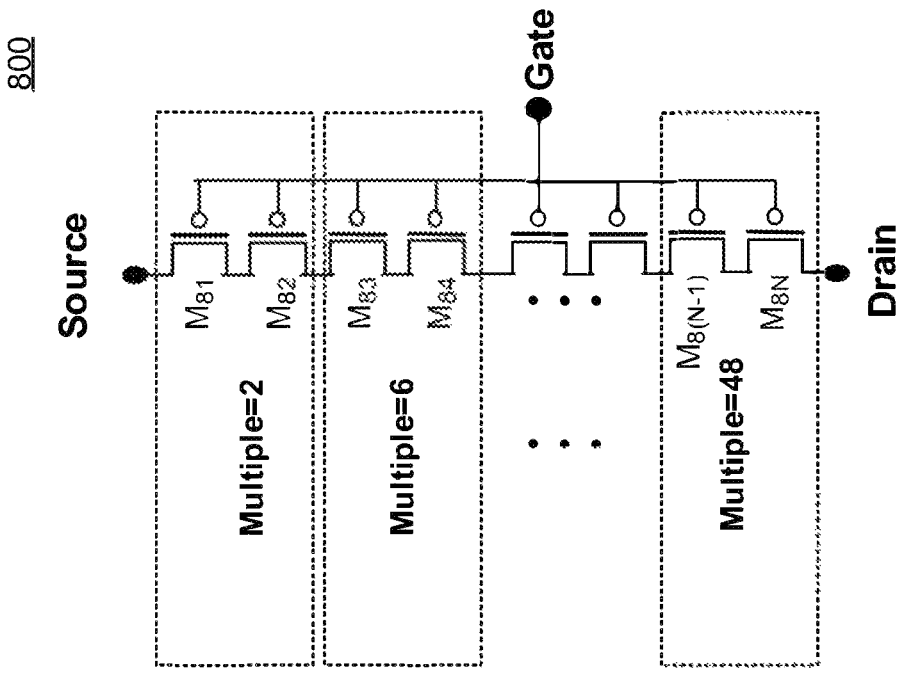
FIG. 7 and FIG. 8 are diagrams illustrating two different exemplary arrangements of stacked-gate circuits, in accordance with some embodiments of the present disclosure.
Figure 7:
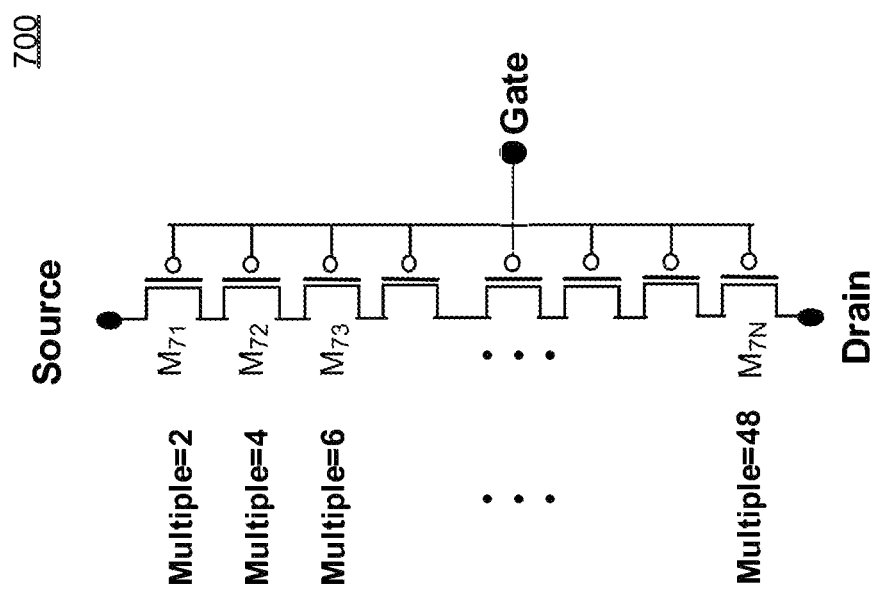

FIG. 7 and FIG. 8 are diagrams illustrating two different exemplary arrangements of stacked-gate circuits 700 and 800 in accordance with some embodiments of the present disclosure. As illustrated in FIG. 7, the stacked-gate circuit 700 includes N stages of transistors M71-M7$n$ coupled in series, and gate terminals of transistors M71-M7$n$ are coupled together to a control terminal (e.g., the gate terminal) of the stacked-gate circuit 700. The number of the units (e.g., the multiple value) in each stage circuit is greater than the number of the units (e.g., the multiple value) in a previous stage circuit coupled to the current stage circuit. In some embodiments, the first stage (e.g., the transistor M71) coupled to the source end of the stacked-gate circuit 700 may have the smallest multiple value, and the last stage (e.g., the transistor M7$n$) coupled to the drain end of the stacked-gate circuit 700 may have the largest multiple value.

Similarly, as illustrated in FIG. 8, the stacked-gate circuit 800 includes N stages of transistors M81-M8$n$ coupled in series, and gate terminals of transistors M81-M8$n$ are coupled together to a control terminal (e.g., the gate terminal) of the stacked-gate circuit 800. Compared to the stacked-gate circuit 700, in the stacked-gate circuit 800, two adjacent stages of transistors M81-M8$n$ are grouped together and share the same multiple value. For examples, first two stages (e.g., transistors M81 and M82) have the same multiple value of 2, and the next two stages (e.g., transistors M83 and M84) have the same multiple value of 6, etc.

In the stacked-gate circuit 800, the number of the units in each stage circuit is greater than or equal to the number of the units (e.g., the multiple value) in a previous stage circuit coupled to the current stage circuit. For example, a drain terminal of the first stage circuit (e.g., transistor M82) is coupled to a source terminal of the second stage circuit (e.g., transistor M83), and a source terminal of the first stage circuit (e.g., transistor M82) is coupled to a drain terminal of the third stage circuit (e.g., transistor M81). Gate terminals of the first stage circuit, the second stage circuit, and the third stage circuit are coupled together.

The first stage circuit (e.g., transistor M82) and the third stage circuit (e.g., transistor M81) both include m units (e.g., 2 units) coupled in parallel. Each of the m units includes one or more transistors coupled in series. The second stage circuit (e.g., transistor M83) includes n units (e.g., 6 units) coupled in parallel, in which m and n are different positive integers. Each of the n units includes one or more transistors coupled in series.

In some embodiments, the first group of stage(s) (e.g., the transistors M81 and M82) coupled to the source end of the stacked-gate circuit 800 may have the smallest multiple value, and the last group of stage(s) (e.g., the transistors M8($n$-1) and M8$n$) coupled to the drain end of the stacked-gate circuit 800 may have the largest multiple value. In the embodiments of FIG. 8, each group includes 2 stages of transistors having the same multiple value, but the present disclosure is not limited thereto. For example, in some other embodiments, any number of stages can be grouped to have the same multiple value according to actual needs of the circuit application.

Embodiments shown in FIG. 8 can be denoted by the following expression:

$$Nx=N(x-1)>N(x-2)=N(x-3)\ldots>N2=N1$$

In the above expression, Nx denotes the number of units in the xth stage.

It would be understood that other combinations are possible as long as the number of the units in each stage circuit is greater than or equal to the number of the units (e.g., the multiple value) in a previous stage circuit coupled to the current stage circuit, which can be denoted by the following expression:

$$Nx \geq N(x-1) \geq \ldots > N3 \geq N2 \geq N1$$

For example, in some embodiments, the number of the units can be the same for a number of stages adjacent to the source side of the circuit, and be different values in strictly ascending order for a number of stages adjacent to the drain side of the circuit, which can be denoted by the following expressions:

$$Nx > N(x-1) > N(x-2)$$

$$N3 = N2 = N1$$

For example, in some embodiments, the number of the units can be different values in strictly ascending order for a number of stages adjacent to the source side of the circuit, and be the same for a number of stages adjacent to the drain side of the circuit, which can be denoted by the following expressions:

$$Nx = N(x-1) = N(x-2)$$

$$N3 > N2 > N1$$

Figure 9:
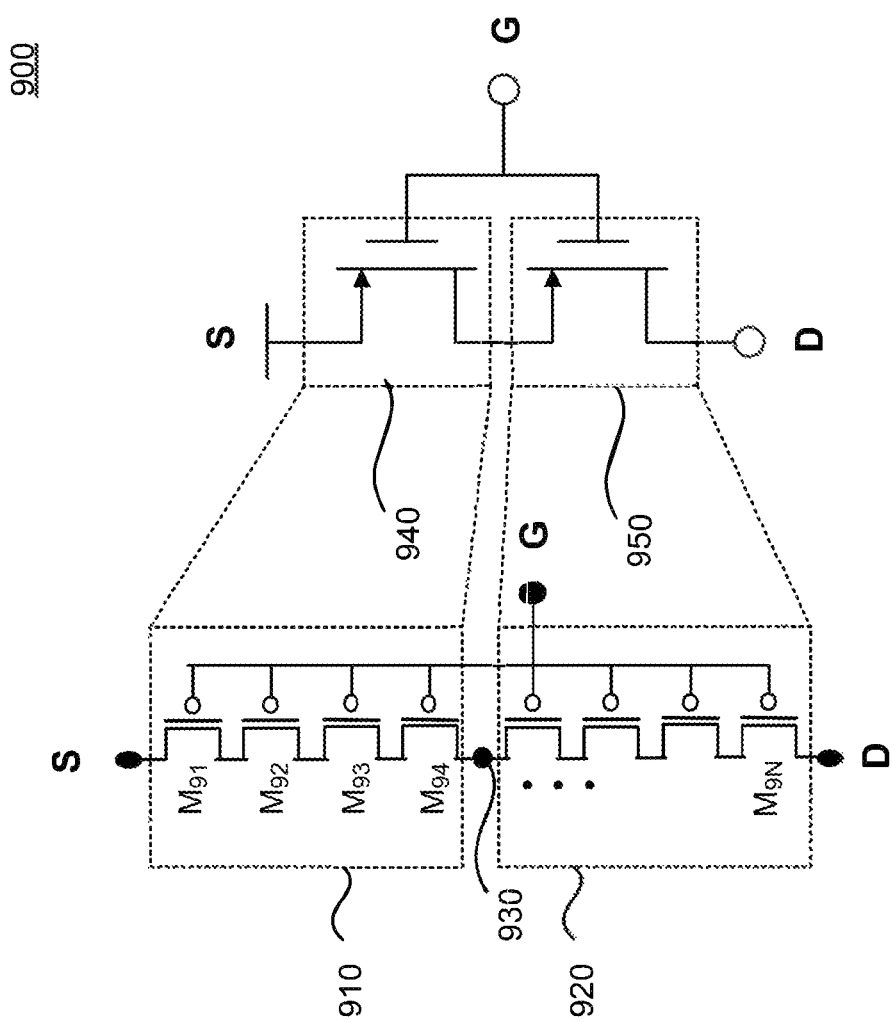
FIG. 9 is a diagram illustrating a stacked-gate circuit, in accordance with some embodiments of the present disclosure.

Reference is made to FIG. 9, which is a diagram illustrating a stacked-gate circuit 900 in accordance with some embodiments of the present disclosure. As illustrated in FIG. 9, similar to the stacked-gate circuit 700 in FIG. 7 and the stacked-gate circuit 800 in FIG. 8, the stacked-gate circuit 900 also includes N stages of transistors M91-M9n coupled in series, and gate terminals of transistors M91-M9n are coupled together to a control terminal (e.g., the gate terminal) of the stacked-gate circuit 900. A source node of the stacked-gate circuit 900 is connected to a source terminal of the transistor M91. A drain node of the stacked-gate circuit 900 is connected to a drain terminal of the transistor M9N.

In some embodiments, different stages of transistors M91-M9n may have different threshold voltages. For example, transistors M91-M94, having a first threshold voltage, in a region 910 adjacent to the source side (e.g., the side close to the positive supply voltage terminal) can form a first stage circuit 940. Remaining transistors, having a second threshold voltage different from the first threshold voltage of the transistors M91-M94, in another region 920 adjacent to the drain side (e.g., the side close to the system ground) can form a second stage circuit 950. As shown in FIG. 9, the drain terminal of the first stage circuit 940 is coupled to a source terminal of the second stage circuit 950 at a node 930.

In some embodiments, the first threshold voltage of the transistors M91-M94 in the region 910 is greater than the second threshold voltage of the remaining transistors in the region 920. By arranging the transistors M91-M94 with a relatively high threshold voltage adjacent to the source side, the output impedance of the stacked-gate circuit 900 can be increased. On the other hand, by arranging the remaining transistors in the second stage circuit 950 with a relatively low threshold voltage adjacent to the drain side, the transconductance (Gm) of the stacked-gate circuit 900 can be increased.

In some embodiments, as discussed above, the transistors M91-M94 in the first stage circuit 940 near the source terminal of the stacked-gate circuit 900 may operate at the linear region as the source degeneration resistor. By implementing transistors M91-M94 using transistors with higher threshold voltages, the resistance of the transistors M91-M94 on the source side can be increased and can result in an improvement of the gain under the same device dimension. With the gain improvement, the number of stages of stacked-gate circuit, and their occupying area can be reduced, without degrading the circuit performance.

For example, in some embodiments, a simulation indicates that a gain of around +6.2 dB can be achieved if a 12-stage circuit with a high threshold voltage for transistors is replaced by a 10-stage circuit with the high threshold voltage for transistors and a 2-stage circuit with a low threshold voltage for transistors. All stages in the simulation have the same multiple value (e.g., 14). In some embodiments, different arrangements of transistors having different threshold voltages at different stages can be selected to optimize performance of various types of analog circuit applications. The stacked-gate circuit 900 shown in FIG. 9 and simulation results discussed above are merely examples and not meant to limit the present disclosure. Alternatively stated, two or more types of transistors having different threshold voltages can be arranged in different stages of the stacked-gate circuit 900 based on the needs in various circuit applications.

Figure 11:
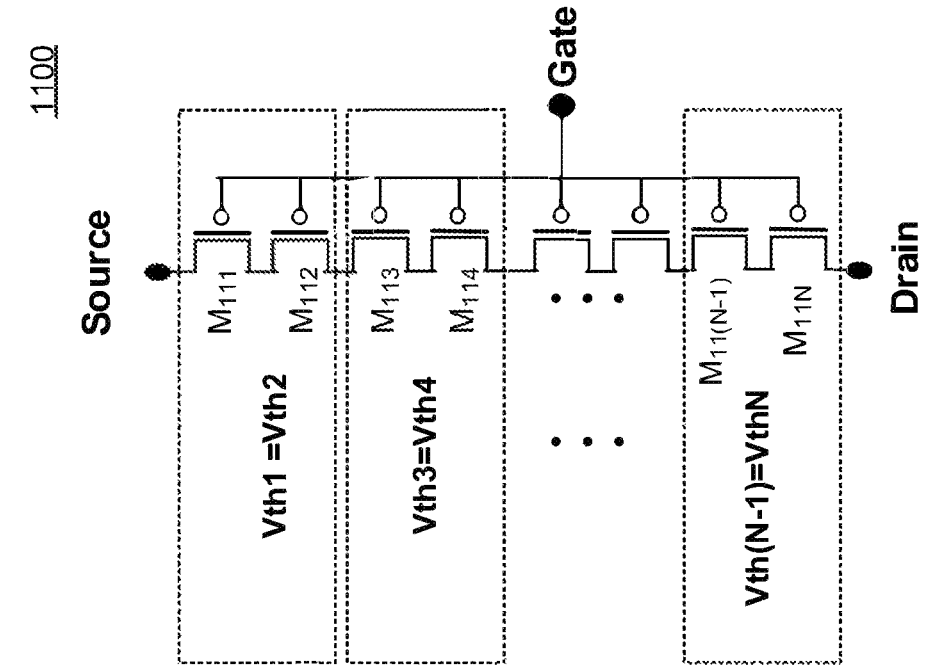
FIG. 10 and FIG. 11 are diagrams illustrating two exemplary arrangements of stacked-gate circuits, in accordance with some embodiments of the present disclosure.
Figure 10:
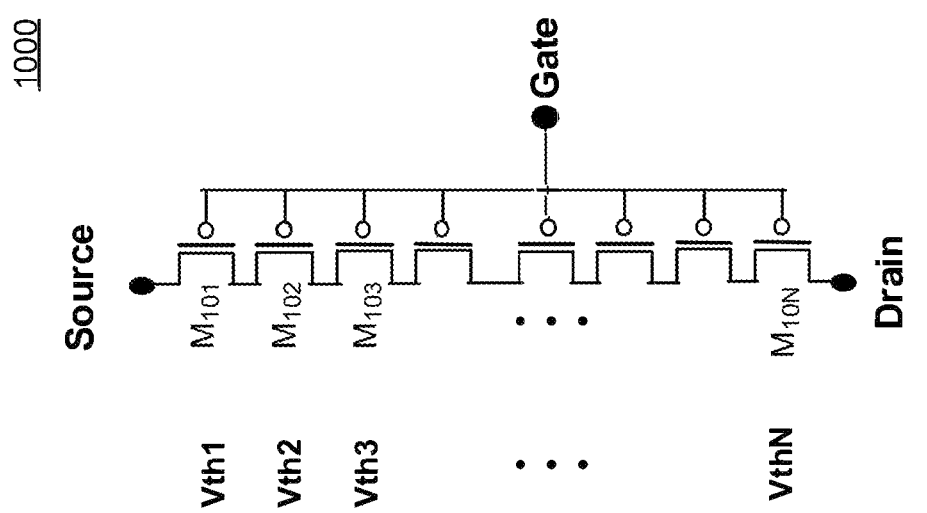

FIG. 10 and FIG. 11 are diagrams illustrating two different exemplary arrangements of stacked-gate circuits 1000 and 1100 in accordance with some embodiments of the present disclosure. As illustrated in FIG. 10, the stacked-gate circuit 1000 includes N stages of transistors M101-M10n coupled in series, and gate terminals of transistors M101-M10n are coupled together to a control node (e.g., the gate terminal) of the stacked-gate circuit 1000. A source node of the stacked-gate circuit 1000 is connected to a source terminal of the transistor M101. A drain node of the stacked-gate circuit 1000 is connected to a drain terminal of the transistor M10N. Each stage circuit may include one or more units of the transistors coupled in parallel. The threshold voltage in each stage circuit is smaller than the threshold voltage in a previous stage circuit coupled to the current stage circuit. In some embodiments, the first stage (e.g., the transistor M101) coupled to the source node of the stacked-gate circuit 1000 may have the highest threshold voltage Vth1, and the last stage (e.g., the transistor M10n) coupled to the drain node of the stacked-gate circuit 1000 may have the lowest threshold voltage Vthn.

Similarly, as illustrated in FIG. 11, the stacked-gate circuit 1100 includes N stages of transistors M111-M11n coupled in series, and gate terminals of transistors M111-M11n are coupled together to a control terminal (e.g., the gate terminal) of the stacked-gate circuit 1100. A source node of the stacked-gate circuit 1100 is connected to a source terminal of the transistor M111. A drain node of the stacked-gate circuit 1100 is connected to a drain terminal of the transistor M11N. Compared to the stacked-gate circuit 1000, in the stacked-gate circuit 1100, two or more adjacent stages of transistors M111-M11n can be grouped together and implemented by the transistors having the same threshold voltage. For examples, first two stages (e.g., transistors M111 and M112) can be implemented by the transistors having the first threshold voltage Vth1, the next two stages (e.g., transistors M113 and M114) can be implemented by the transistors having the second threshold voltage Vth2 smaller than the first threshold voltage Vth1, etc.

In the stacked-gate circuit 1100, the threshold voltage in each stage circuit is lower than or equal to the threshold voltage in a previous stage circuit coupled to the current stage circuit. For example, a drain terminal of the first stage circuit (e.g., transistor M112) is coupled to a source terminal of the second stage circuit (e.g., transistor M113), and a source terminal of the first stage circuit (e.g., transistor M112) is coupled to a drain terminal of the third stage circuit (e.g., transistor M111). Gate terminals of the first stage circuit, the second stage circuit, and the third stage circuit are coupled together.

The threshold voltage Vth2 of the transistor M112 is equal to the threshold voltage Vth1 of the transistor M111 in a previous stage circuit coupled to the current stage circuit (e.g., the transistor M112). On the other hand, the threshold voltage Vth3 of the transistor M113 is smaller than the threshold voltage Vth2 of the transistor M112 in a previous stage circuit coupled to the current stage circuit (e.g., the transistor M113).

In some embodiments, the first group of stage(s) (e.g., the transistors M111 and 112) coupled to the source end of the stacked-gate circuit 800 may have the highest voltage threshold, and the last group of stage(s) (e.g., the transistors M11(n−1) and M11n) coupled to the drain end of the stacked-gate circuit 1100 may have the lowest voltage threshold. In the embodiments of FIG. 11, each group includes 2 stages of transistors having the same voltage threshold, but the present disclosure is not limited thereto. For example, in some other embodiments, any number of stages can be grouped to have the same voltage threshold according to actual needs of the circuit application.

Embodiments shown in FIG. 11 can be denoted by the following expression:

$$Vth(n)=Vth(n-1)<Vth(n-2)=Vth(n-3)\ldots <Vth2=Vth1$$

In the above expression, Vth(n) denotes the threshold voltage of transistor(s) in the Nth stage.

It would be understood that other combinations are possible as long as the threshold voltage in each stage circuit is smaller than or equal to the threshold voltage in a previous stage circuit coupled to the current stage circuit, which can be denoted by the following expression:

$$Vthn \leq Vth(n-1) \leq \ldots \leq Vth3 \leq Vth2 \leq Vth1$$

For example, in some embodiments, the threshold voltages can be the same for a number of stages adjacent to the source side of the circuit, and be different values in strictly descending order for a number of stages adjacent to the drain side of the circuit, which can be denoted by the following expressions:

$$Vthn<Vth(n-1)<Vth(n-2)$$

$$Vth3=Vth2=Vth1$$

For example, in some embodiments, the threshold voltages can be different values in strictly descending order for a number of stages adjacent to the source side of the circuit, and be the same for a number of stages adjacent to the drain side of the circuit, which can be denoted by the following expressions:

$$Vthn=Vth(n-1)=Vth(n-2)$$

$$Vth3<Vth2<Vth1$$

It would be appreciated that in different embodiments, the transistors in the integrated circuit can be PMOS or NMOS. Reference is made to FIG. 12A and FIG. 12B. FIG. 12A is a schematic diagram illustrating an integrated circuit 1200a using NMOS in accordance with some embodiments of the present disclosure. As shown in FIG. 12A, the integrated circuit 1200a has two legs 1210a and 1220a. Transistors MA1-MAN in the leg 1210a and MB1-MBN in the leg 1220a have the same multiple value (e.g., the multiple value of 4). In some embodiments, transistors MA1-MA4 and MB1-MB4 in a region 1230a adjacent to the source side (e.g., the side close to the system ground GND) operate at the linear region as source degeneration resistors. FIG. 12B is a schematic diagram illustrating an equivalent circuit 1200b of the integrated circuit 1200a in FIG. 12A, in accordance with some embodiments of the present disclosure. As shown in FIG. 12B, transistors MA1-MA4 and MB1-MB4 can be represented by corresponding equivalent resistors.

Because the transistors MA1-MAN and MB1-MB4 operating at the linear region has little impact on the current mismatch between the current Id1 and current Id2, in some embodiments, the "multiple" value of transistors MA1-MAN and MB1-MBN in the region 1230a can be reduced. By reducing the parallel-connected units of the transistors MA1-MAN and MB1-MBN, the area of the integrated circuit 1200a can be reduced without sacrificing the current mismatch performance.

Reference is made to FIG. 12C and FIG. 12D. FIG. 12C is a schematic diagram illustrating an integrated circuit 1200c using NMOS in accordance with some embodiments of the present disclosure. FIG. 12D is a schematic diagram illustrating an equivalent circuit 1200d of the integrated circuit 1200c in FIG. 12C, in accordance with some embodiments of the present disclosure. Compared to the integrated circuit 1200a in FIG. 12A, as shown in FIG. 12C, each leg in the integrated circuit 1200c include two regions 1230c and 1240c. The region 1230c is adjacent to the source side (e.g., the side close to the system ground), and the region 540c is adjacent to the drain side (e.g., positive supply voltage terminal Vdd).

As shown in FIG. 12C, transistors in the region 1230c (e.g., MA1, MA2, MB1, and MB2) have a first multiple value (e.g., the multiple value of 2), and transistors in the region 1240c have a second multiple value (e.g., the multiple value of 4) being greater than the first multiple value. Because transistors in the region 1230c operate at the linear region as source degeneration resistors, as shown in FIG. 12D, transistors MA1, MA2, MB1, and MB2 can be represented by corresponding equivalent resistors.

In general, the overall resistances of the equivalent circuits 1200b in FIG. 12B and the equivalent circuits 1200d in FIG. 12D are similar. Alternatively stated, in the integrated circuit 1200c, although the multiple value of transistors in the region 1230c is reduced to 2, the resulted source-degeneration resistance is similar to the source-degeneration resistance of the integrated circuit 1200a in which the multiple value is 4. Accordingly, the integrated circuit 1200c can achieve a similar current mismatch performance using a smaller area of the circuit.

Figure 13:
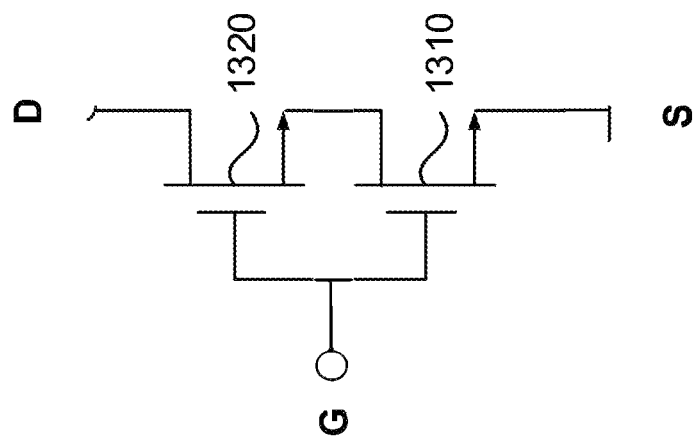
FIG. 13 is a schematic diagram illustrating a stacked-gate circuit using NMOS, in accordance with some embodiments of the present disclosure.

References are made to FIG. 13, which is a schematic diagram illustrating a stacked-gate circuit 1300 using NMOS in accordance with some embodiments of the present disclosure. As illustrated in FIG. 13, the stacked-gate circuit 1300 includes a first stage circuit 1310 and a second stage circuit 1320.

The second stage circuit 1320 is coupled to the first stage circuit 1310. Particularly, the gate terminal of the first stage circuit 1310 is coupled to the gate terminal of the second stage circuit 1320 to form the control terminal G of the stacked-gate circuit 1300. A drain terminal of the first stage circuit 1310 is coupled to a source terminal of the second stage circuit 1320. A source terminal of the first stage circuit 1310 can be configured as a source terminal S of the stacked-gate circuit 1300. A drain terminal of the second stage circuit 1320 can be configured as a drain terminal D of the stacked-gate circuit 1300.

Similar to the stacked-gate circuit 600 using PMOS in FIG. 6, in the stacked-gate circuit 1300, the first stage circuit 1310 includes m units coupled in parallel, in which each unit includes one or more transistors coupled in series. For example, the first stage circuit 1310 may include 24 units (e.g., with the multiple value of 24) and 16 stages of transistors with their respective gates coupled together. The second stage circuit 1320 includes n units coupled in parallel, in which each unit includes one or more transistors coupled in series. For example, the second stage circuit 1320 may include 42 units (e.g., with the multiple value of 42) and 24 stages of transistors with their respective gates coupled together. As explained above, m and n are different positive integers. In some embodiments, m can be any positive integer smaller than n to reduce the circuit area of the first stage circuit 1310.

Figure 14:
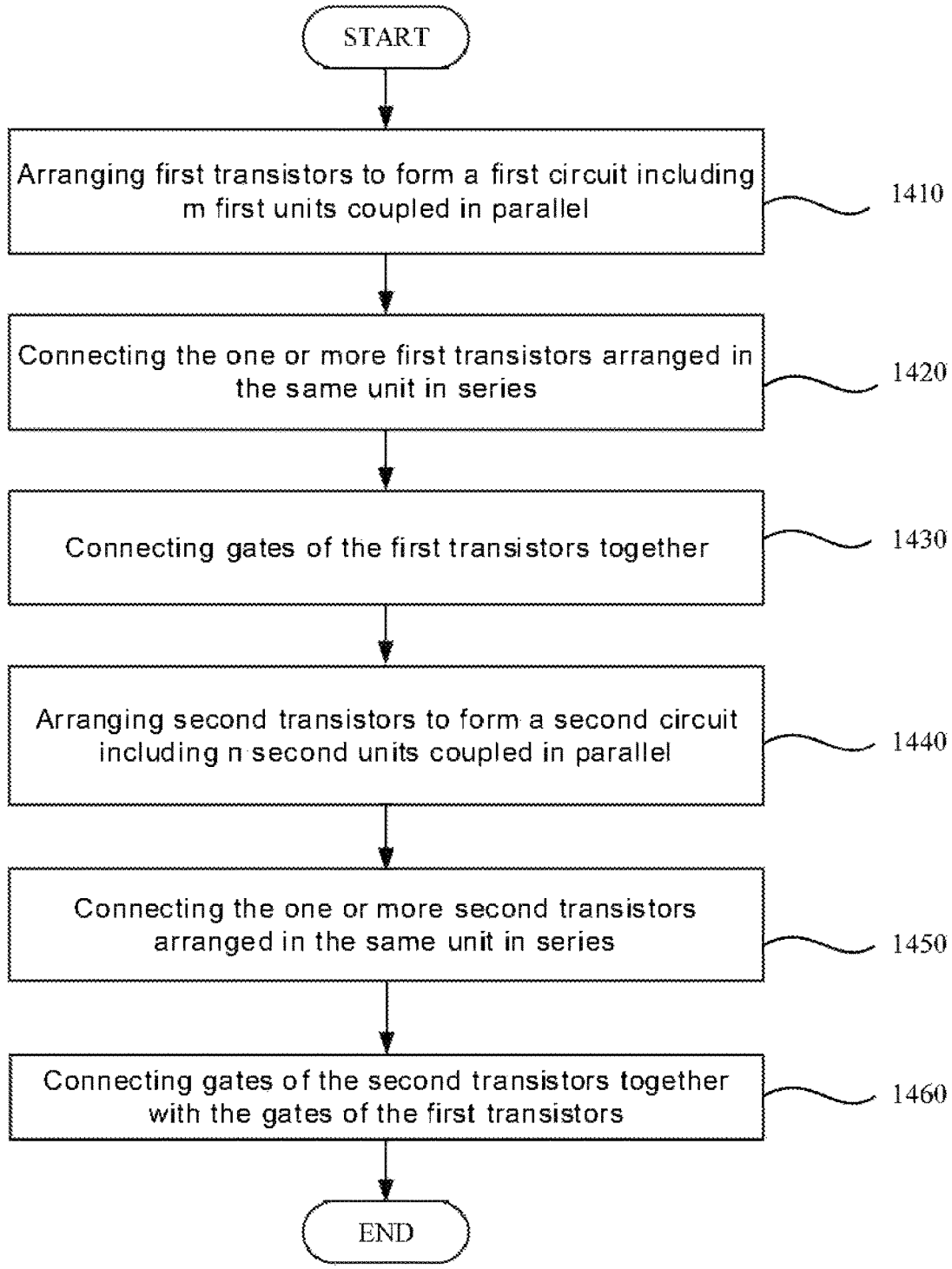
FIG. 14 is a flow chart illustrating a method for manufacturing an integrated circuit, in accordance with some embodiments of the present disclosure.

Reference is made to FIG. 14. FIG. 14 is a flow chart illustrating a method 1400 for manufacturing an integrated circuit, in accordance with some embodiments of the present disclosure. For better understanding of the present disclosure, the method 1400 is discussed in relation to embodiments shown in FIG. 1 to FIG. 13, but is not limited thereto. As shown in FIG. 14, in some embodiments, the method 1400 includes operations 1410-1460.

Operation 1410 is performed for implementing multiple first transistors. First transistors are arranged to form a first circuit including m first units coupled in parallel. Operation 1420 is performed for connecting the one or more first transistors arranged in the same first unit in series between a first reference terminal and a second reference terminal. Operation 1430 is performed for connecting gates of the first transistors together. Accordingly, in some embodiments, first transistors are arranged into m first units by coupling one or more of the first transistors in series in any one of the first units. The first units are coupled in parallel in the first circuit.

Operation 1440 is performed for implementing multiple second transistors. Second transistors are arranged to form a second circuit coupled to the first circuit. The second circuit includes n second units coupled in parallel. Operation 1450 is performed for connecting the one or more second transistors arranged in the same second unit in series between the second reference terminal and a third reference terminal. Accordingly, in some embodiments, second transistors are arranged into n second units by coupling one or more of the second transistors in series in any one of the second units. The second units are coupled in parallel in the second circuit. The number of second units in the second circuit may be different from the number of first units in the first circuit. Alternatively stated, m and n may be different positive integers. For example, if a drain terminal of the first circuit is coupled to a source terminal of the second circuit, m may be smaller than n.

Operation 1460 is performed for connecting gates of the second transistors together with the gates of the first transistors. Accordingly, the second circuit is coupled to the first circuit. In some embodiments, the first transistors and the second transistors can be implemented by transistors having the same threshold voltage. In some other embodiments, the first transistors and the second transistors can be implemented by transistors having different threshold voltages.

In some embodiments, the method 1400 may include optional operations to form multiple stage circuits, in which each of the stage circuits includes multiple units coupled in parallel, and each of the units includes one or more transistors coupled in series. The number of the units in each stage circuit is greater than or equal to the number of the units in a previous stage circuit. For example, the first circuit can be formed between a third circuit and the second circuit. In some embodiments, the third circuit coupled to the first circuit on the opposite side may also include the same number of units (e.g., m units) coupled in parallel. In some other embodiments, the number of units in the first circuit is greater than the number of units in the third circuit, and the number of units in the second circuit is greater than the number of units in the first circuit.

Figure 15:
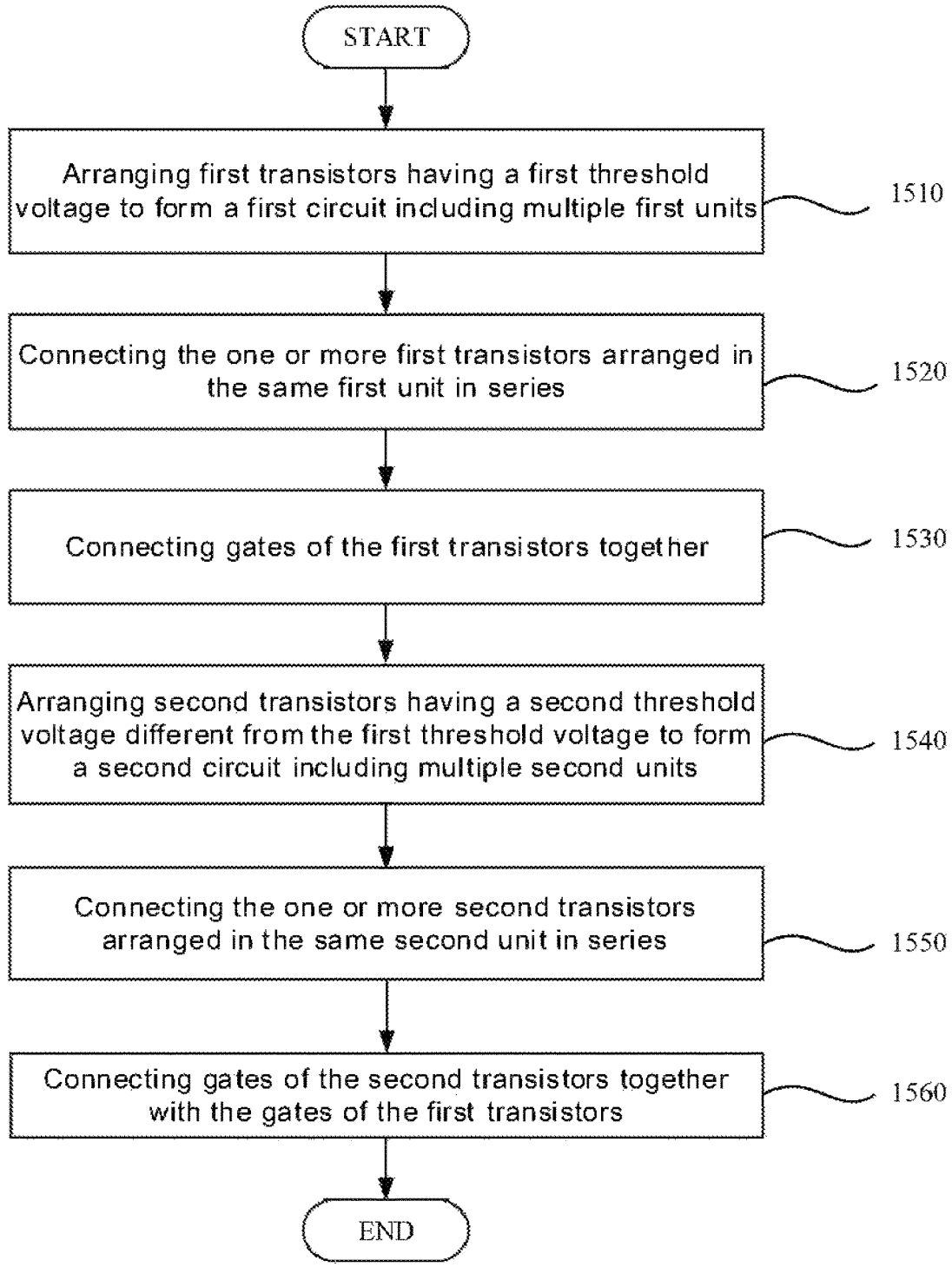
FIG. 15 is a flow chart illustrating a method for manufacturing an integrated circuit, in accordance with some embodiments of the present disclosure.

Reference is made to FIG. 15. FIG. 15 is a flow chart illustrating a method 1500 for manufacturing an integrated circuit, in accordance with some embodiments of the present disclosure. For better understanding of the present disclosure, the method 1500 is discussed in relation to embodiments shown in FIG. 1 to FIG. 13, but is not limited thereto. As shown in FIG. 15, in some embodiments, the method 1500 includes operations 1510-1560.

Operation 1510 is performed for implementing multiple first transistors having a first threshold voltage. First transistors are arranged to form a first circuit including multiple units coupled in parallel. Operation 1520 is performed for connecting the one or more first transistors arranged in the same unit in series between a first reference terminal and a second reference terminal. Operation 1530 is performed for connecting gates of the first transistors together.

Operation 1540 is performed for implementing multiple second transistors having a second threshold voltage different from the first threshold voltage. Second transistors are arranged to form a second circuit coupled to the first circuit. The second circuit includes multiple units coupled in parallel. Operation 1550 is performed for connecting the one or more second transistors arranged in the same unit in series between the second reference terminal and a third reference terminal. The number of units in the second circuit can be the same or different from the number of units in the first circuit. Operation 1560 is performed for connecting control terminals (e.g., gates) of the second transistors together with the control terminals (e.g., gates) of the first transistors. Accordingly, in some embodiments, the first units and the second units are arranged by transistors having different threshold voltages.

In some embodiments, the method 1500 may also include optional operations to form multiple stage circuits, in which each of the stage circuits includes multiple units coupled in parallel, and each of the units includes one or more transistors coupled in series. The threshold voltage of transistors in each stage circuit is lower than or equal to the threshold voltage of transistors in a previous stage circuit. For example, the first circuit can be formed between a third circuit and the second circuit. In some embodiments, the third circuit coupled to the first circuit on the opposite side may include third transistors having the same threshold voltage as the first transistors in the first circuit. In some other embodiments, the threshold voltage of the third transistors is greater than the threshold voltage of the first transistors, and the threshold voltage of the first transistors is greater than the threshold voltage of the second transistors.

The above illustrations include exemplary operations, but the operations are not necessarily performed in the order shown. Operations may be added, replaced, changed order, and/or eliminated as appropriate, without departing from the spirit and scope of the present disclosure.

By arranging different numbers of units in different stages, or arranging transistors having different threshold voltages in different stages, the circuit area reduction can be achieved without undesirable performance degradation, which provides enhanced circuit design flexibility in space-constrained applications.

In some embodiments, an integrated circuit is disclosed that includes a first circuit including m first units coupled in parallel, any of the first units including one or more first transistors coupled in series; and a second circuit including n second units coupled in parallel, any of the second units including one or more second transistors coupled in series. A gate terminal of the first circuit is coupled to a gate terminal of the second circuit, and m and n are different positive integers.

In some embodiments, a circuit is also disclosed that includes a first stacked-gate circuit including first transistors with gate terminals, the gate terminals of the first transistors being coupled to each other; and a second stacked-gate circuit coupled to the first stacked-gate circuit, the second stacked-gate circuit including second transistors with gate terminals, the gate terminals of the second transistors being coupled to each other. A threshold voltage of the first transistors is greater than a threshold voltage of the second transistors.

In some embodiments, a method is also disclosed. The method includes arranging first transistors into m first units by coupling one or more of the first transistors in series in any one of the first units; coupling the first units in parallel in a first circuit; arranging second transistors into n second units by coupling one or more of the second transistors in series in any one of the second units, m and n being different positive integers; coupling the second units in parallel in a second circuit; and coupling the second circuit to the first circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first circuit comprising m first units electrically coupled in parallel, any of the first units comprising a plurality of first transistors coupled to each other in series; and
   a second circuit coupled to the first circuit, the second circuit comprising n second units electrically coupled in parallel, any of the second units comprising a plurality of second transistors coupled to each other in series, m and n being different positive integers greater than 1;
   wherein a threshold voltage of the first transistors is greater than a threshold voltage of the second transistors, and a control node of the circuit is coupled to gate terminals of the first transistors and gate terminals of the second transistors and configured to receive a bias voltage.

2. The circuit of claim 1, wherein a source of the circuit is connected to a source terminal of one of the first transistors in the first circuit, a drain of the circuit is connected to a drain terminal of one of the second transistors in the second circuit.

3. The circuit of claim 1, wherein the first transistors arranged in the m first units are of the same type;
   wherein the second transistors arranged in the n second units are of the same type.

4. The circuit of claim 1, wherein a drain terminal of the first circuit is coupled to a source terminal of the second circuit, and m is smaller than n.

5. The circuit of claim 1, further comprising:
   a third circuit coupled to the second circuit, the third circuit comprising a plurality of third transistors with gate terminals, the gate terminals of the third transistors being coupled to each other;
   wherein the threshold voltage of the second transistors is greater than a threshold voltage of the third transistors.

6. The circuit of claim 5, wherein the third transistors are arranged in a plurality of third units coupled in parallel, the third transistors in a same third unit being coupled in series.

7. An integrated circuit, comprising:
   a plurality of first circuit units electrically coupled in parallel to provide a first gate terminal, a first source terminal, and a first drain terminal, any of the first circuit units comprising one or more first transistors coupled in series; and
   a plurality of second circuit units electrically coupled in parallel to provide a second gate terminal, a second source terminal, and a second drain terminal, any of the second circuit units comprising one or more second transistors coupled in series, wherein the one or more first transistors and the one or more second transistors are of the same type;
   wherein the number of the first circuit units is different from the number of the second circuit units, and the first gate terminal is coupled to the second gate terminal and configured to receive a bias voltage.

8. The integrated circuit of claim 7, wherein the first drain terminal is coupled to the second source terminal, and the number of the first circuit units is smaller than the number of the second circuit units.

9. The integrated circuit of claim 7, further comprising:
   a plurality of third circuit units coupled in parallel to provide a third gate terminal, a third source terminal, and a third drain terminal, any of the third circuit units comprising one or more third transistors coupled in series,
   wherein the first source terminal is coupled to the third drain terminal, and the number of the first circuit units is equal to the number of the third circuit units.

10. The integrated circuit of claim 7, further comprising:
    a plurality of stage circuits, any of the stage circuits comprising a plurality of units coupled in parallel, any of the units comprising one or more transistors coupled in series, wherein the number of the units in one stage circuit is greater than or equal to the number of the units in a previous stage circuit.

11. The integrated circuit of claim 7, wherein a threshold voltage of the one or more first transistors and a threshold voltage of the one or more second transistors are different.

12. The integrated circuit of claim 7, wherein the first drain terminal is coupled to the second source terminal, and a threshold voltage of the one or more first transistors is greater than a threshold voltage of the one or more second transistors.

13. The integrated circuit of claim 7, further comprising:
    a plurality of third circuit units coupled in parallel to provide a third gate terminal, a third source terminal, and a third drain terminal, any of the third circuit units comprising one or more third transistors coupled in series, wherein the first source terminal is coupled to the third drain terminal, and a threshold voltage of the one or more first transistors and a threshold voltage of the one or more third transistors are the same.

14. The integrated circuit of claim 7, further comprising:
a plurality of stage circuits, any of the stage circuits comprising a plurality of units coupled in parallel, any of the units comprising a plurality of transistors coupled in series, wherein a threshold voltage of the transistors in one stage circuit is lower than or equal to a threshold voltage of the transistors in a previous stage circuit.

15. An integrated circuit, comprising:
a first circuit comprising a plurality of first transistors arranged into m first units electrically coupled in parallel, wherein one or more of the first transistors are coupled in series in any one of the first units; and
a second circuit coupled to the first circuit, the second circuit comprising a plurality of second transistors arranged into n second units electrically coupled in parallel, wherein one or more of the second transistors are coupled in series in any one of the second units, m and n being different positive integers;

wherein gate terminals of the first transistors and gate terminals of the second transistors are coupled to each other and configured to receive a bias voltage, and the first transistors and the second transistors are of the same type.

16. The integrated circuit of claim 15, wherein drain terminals of the first units are coupled to source terminals of the second units, and m is smaller than n.

17. The integrated circuit of claim 15, further comprising:
a third circuit comprising a plurality of third transistors arranged into m third units, wherein one or more of the third transistors are coupled in series in any one of the third units;
wherein the third units are coupled in parallel in the third circuit, and the third circuit is coupled to the first circuit.

18. The integrated circuit of claim 17, wherein the first transistors and the third transistors have a same threshold voltage.

19. The integrated circuit of claim 15, wherein the first transistors and the second transistors have different threshold voltages.

20. The integrated circuit of claim 15, wherein control terminals of the first transistors are connected to control terminals of the second transistors.

* * * * *